United States Patent
Patil et al.

(10) Patent No.: US 9,831,175 B2
(45) Date of Patent: Nov. 28, 2017

(54) METHOD, APPARATUS, AND SYSTEM FOR E-FUSE IN ADVANCED CMOS TECHNOLOGIES

(71) Applicant: GLOBALFOUNDRIES INC., Grand Cayman (KY)

(72) Inventors: Suraj Kumar Patil, East Fishkill, NY (US); Min-Hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/489,404

(22) Filed: Apr. 17, 2017

(65) Prior Publication Data
US 2017/0221823 A1    Aug. 3, 2017

Related U.S. Application Data

(62) Division of application No. 14/936,582, filed on Nov. 9, 2015, now Pat. No. 9,659,862.

(51) Int. Cl.
| | |
|---|---|
| *H01L 21/8238* | (2006.01) |
| *H01L 23/525* | (2006.01) |
| *H01L 45/00* | (2006.01) |
| *H01L 27/112* | (2006.01) |
| *H01L 23/62* | (2006.01) |
| *H01L 23/535* | (2006.01) |

(52) U.S. Cl.
CPC ........ *H01L 23/5256* (2013.01); *H01L 23/535* (2013.01); *H01L 23/62* (2013.01); *H01L 27/11206* (2013.01); *H01L 45/085* (2013.01); *H01L 45/1233* (2013.01)

(58) Field of Classification Search
USPC .................................................. 257/2; 43/215
See application file for complete search history.

(56) References Cited

U.S. PATENT DOCUMENTS

| | | | |
|---|---|---|---|
| 7,391,097 B2 * | 6/2008 | Kothandaraman | H01L 23/5256 257/209 |
| 9,065,046 B2 * | 6/2015 | Kang | H01L 45/146 |
| 9,171,801 B2 * | 10/2015 | Bao | H01L 23/5256 |
| 9,214,245 B2 * | 12/2015 | Choi | H01L 23/5256 |
| 9,305,879 B2 * | 4/2016 | Filippi | H01L 23/5256 |
| 2006/0278932 A1 * | 12/2006 | Kothandaraman | H01L 23/5256 257/368 |
| 2013/0176073 A1 * | 7/2013 | Bao | H01L 23/5226 327/525 |
| 2014/0332923 A1 * | 11/2014 | Filippi | H01L 23/5256 257/529 |
| 2014/0332924 A1 * | 11/2014 | Bao | H01L 23/5256 257/529 |
| 2014/0339488 A1 * | 11/2014 | Kang | H01L 45/146 257/2 |

(Continued)

*Primary Examiner* — Telly Green
(74) *Attorney, Agent, or Firm* — Williams Morgan, P.C.

(57) ABSTRACT

Methods, apparatus, and systems for fabricating and using a semiconductor device comprising a first conductive element; a second conductive element; and an e-fuse comprising a first region comprising a conductive oxide of a first metal; and a second region comprising a second metal, wherein an oxide of the second metal is resistive; wherein the e-fuse is electrically connected to both the first conductive element and the second conductive element.

20 Claims, 6 Drawing Sheets

(56) References Cited

U.S. PATENT DOCUMENTS

2015/0206603 A1* 7/2015 Choi .................. H01L 23/5256
257/529
2015/0235946 A1* 8/2015 Bonilla .............. H01L 23/5226
257/758

* cited by examiner

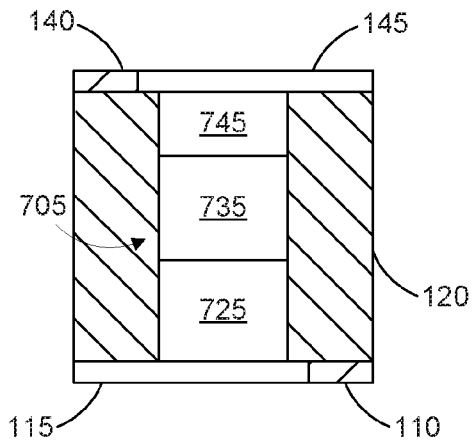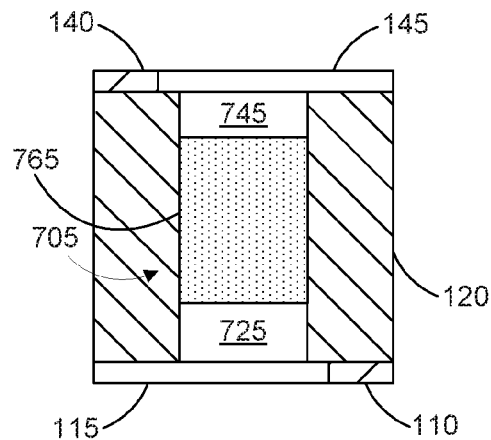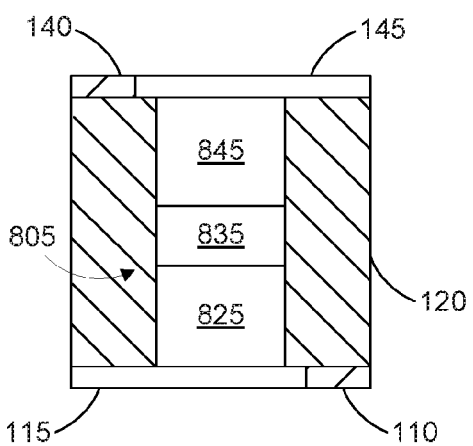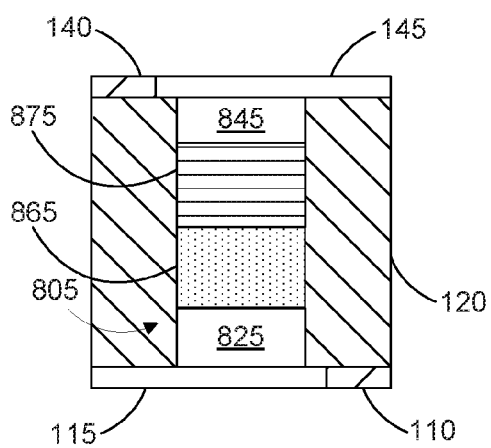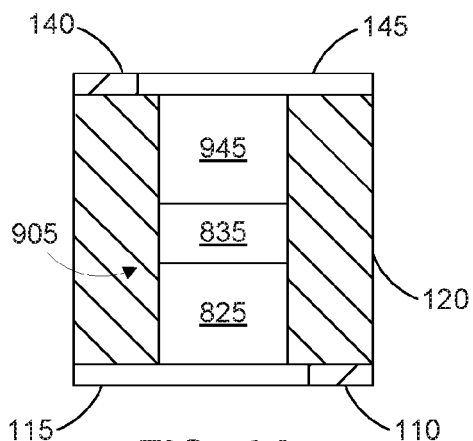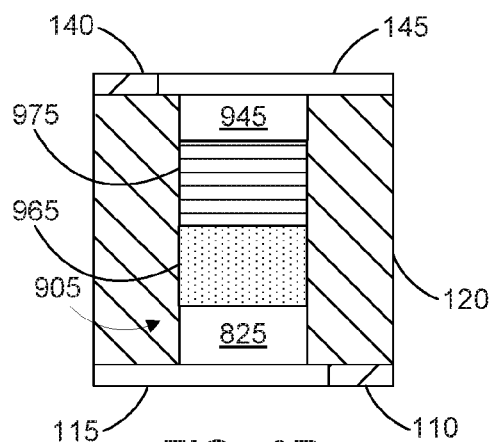

METHOD, APPARATUS, AND SYSTEM FOR E-FUSE IN ADVANCED CMOS TECHNOLOGIES

BACKGROUND OF RELATED APPLICATIONS

This application is a divisional of co-pending U.S. Patent Application No. 14/936,582, filed Nov. 9, 2015.

BACKGROUND OF THE INVENTION

Field of the Invention

Generally, the present disclosure relates to the manufacture of sophisticated semiconductor devices, and, more specifically, to various methods, structures, and systems for preparing and using an electrical fuse (e-fuse) in semiconductor devices.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Known for today's semiconductor devices are e-fuses. E-fuses enable dynamic customization of on-chip circuitry, i.e., a circuit can be converted from closed to open by "blowing" an e-fuse. Currently, silicide, polysilicon, and metal-based e-fuses are known. Such e-fuses may be blown by the application of a high electrical voltage or current, which may be a programmable voltage or current. Given that all non-superconducting materials have some resistance, the high electrical current flowing through heats the e-fuse. Heating the e-fuse may lead to thermal rupture, electromigration, or a combination thereof, thereby breaking the conductive path through ("blowing") the e-fuse.

Unfortunately, known e-fuse approaches suffer a number of shortcomings that preclude full adoption of this useful technology in recent CMOS device architectures. Forming silicides typically requires high temperatures (greater than about 400° C.). Silicide-based e-fuses are generally limited by their size (finite resistance) and hence scalability. Also, in advanced complementary metal-oxide-semiconductor (CMOS) fabrication processes, silicides cannot be readily formed before a replacement metal gate (RMG). Metal e-fuses avoid some of the shortcomings of silicides, but suffer from poor reliability and defects. Blowing a metal e-fuse typically involves electromigration (movement of atoms in the presence of an electric field). Thus, metal e-fuses typically require large size (due to finite resistance), further process complexity (e.g., extra masks, etch steps etc.) in preparing migration zones and destinations within a nascent semiconductor device, and a high electrical programmable current/voltage (typically 1-10 V and 1-100 mA) to blow the e-fuse.

Therefore, it would be desirable to have an e-fuse that can be readily fabricated in RMG, middle-of-line (MOL) or back-end-of-line (BEOL) processes (and/or in processes forming finned field-effect transistor (FinFET) devices), at small sizes (on the order of tens of nanometers) that are thus scalable, at ambient temperatures, with minimal modification of existing semiconductor device fabrication processes, and/or that can be easily blown with relatively low programmable voltage/current with greater reliability and lower defect densities.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and systems for fabricating and using a semiconductor device comprising a first conductive element; a second conductive element; and an e-fuse comprising a first region comprising a conductive oxide of a first metal and a second region comprising a second metal, wherein an oxide of the second metal is resistive; wherein the e-fuse is electrically connected to both the first conductive element and the second conductive element.

BRIEF DESCRIPTION OF THE DRAWINGS

The disclosure may be understood by reference to the following description taken in conjunction with the accompanying drawings, in which like reference numerals identify like elements, and in which:

FIG. 7A illustrates a stylized cross-sectional depiction of a second e-fuse in a conductive conformation, in accordance with embodiments herein;

FIG. 7B illustrates a stylized cross-sectional depiction of the second e-fuse in a resistive conformation, in accordance with embodiments herein;

FIG. 8A illustrates a stylized cross-sectional depiction of a third e-fuse in a conductive conformation, in accordance with embodiments herein;

FIG. 8B illustrates a stylized cross-sectional depiction of the third e-fuse in a resistive conformation, in accordance with embodiments herein;

FIG. 9A illustrates a stylized cross-sectional depiction of a fourth e-fuse in a conductive conformation, in accordance with embodiments herein;

FIG. 9B illustrates a stylized cross-sectional depiction of the fourth e-fuse in a resistive conformation, in accordance with embodiments herein;

Figure 1:
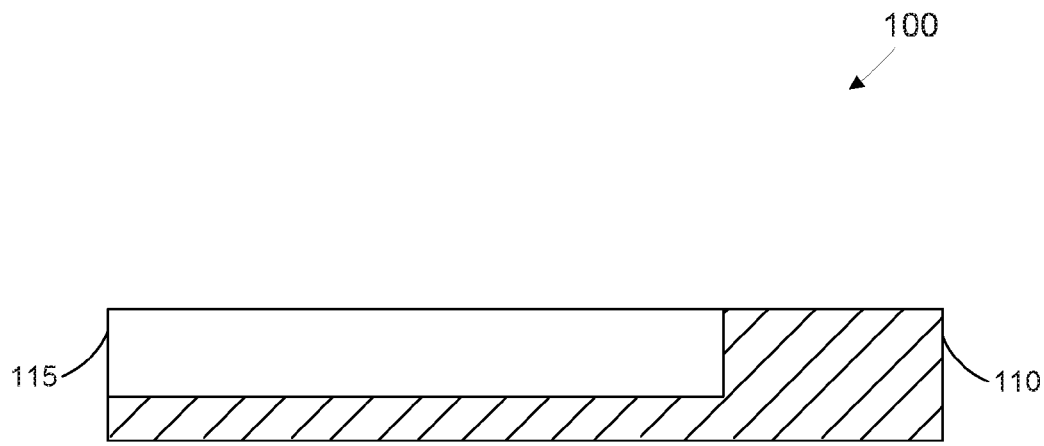
FIG. 1 illustrates a stylized cross-sectional depiction of a semiconductor device in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for an e-fuse that may be incorporated into semiconductor devices through CMOS fabrication technologies. In one embodiment, the e-fuse may be a component of a vertical metal stack. One or more e-fuses according to some embodiments of the present disclosure may be converted from a conductive to a resistive conformation more reliably and/or with lower power than silicide-based e-fuses discussed above.

Turning now to FIG. 1, we present a stylized cross-sectional depiction of a semiconductor device in accordance with embodiments herein. Semiconductor device 100 comprises a first conductive element 115 (e.g., a first metal layer) disposed within a first insulating layer 110. The first insulating layer 110 may comprise any material known to the person of ordinary skill in the art as an electrical insulator suitable for use in semiconductor devices. In one embodiment, the first insulating layer 110 may comprise silicon oxide, a low-K dielectric, or another dielectric material known to the person of ordinary skill in the art. The first conductive element 115 may comprise any material known to the person of ordinary skill in the art as an electrical conductor suitable for use in semiconductor devices. In one embodiment, the first conductive element 115 may comprise copper, tungsten, cobalt, or aluminum, among other materials. The first insulating layer 110 and the first conducting element 115 disposed within may be constructed by any techniques known to the person of ordinary skill in the art having the benefit of the present disclosure, and need not be discussed further.

Figure 2:
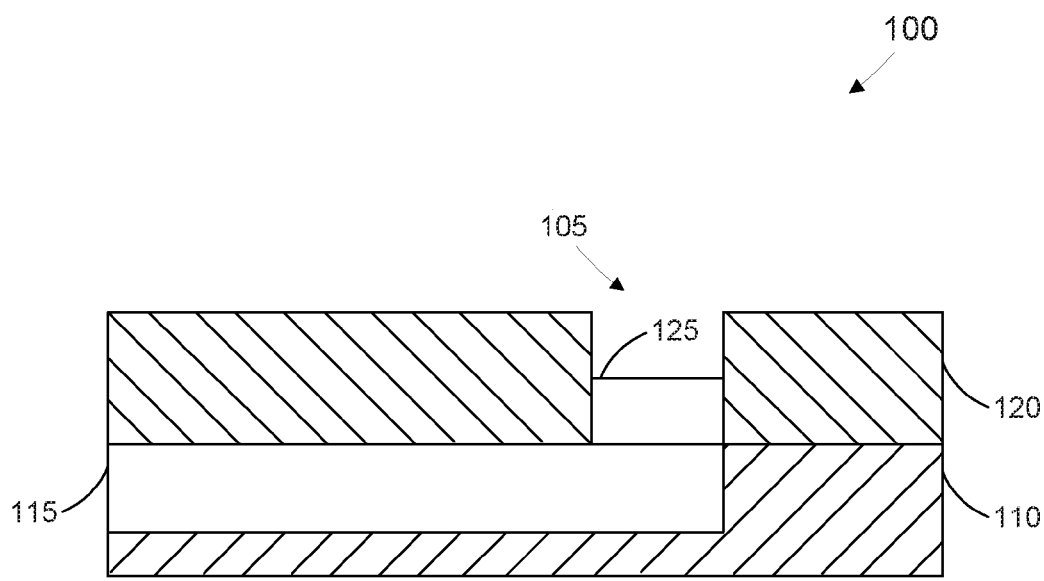
FIG. 2 illustrates a stylized cross-sectional depiction of a semiconductor device in accordance with embodiments herein.

FIG. 2 presents a stylized cross-sectional depiction of the semiconductor device 100 after formation of a second insulating layer 120 and a first region 125 of an e-fuse 105 disposed within the second insulating layer 120. The second insulating layer 120 may comprise any material known to the person of ordinary skill in the art as an electrical insulator suitable for use in semiconductor devices. The second insulating layer 120 may comprise the same or different material relative to the material of first insulating layer 110.

The first region 125 of the e-fuse 105 comprises a conductive oxide of a first metal. As will be apparent to the person of ordinary skill in the art, the first metal has a first electronegativity (tendency to attract electrons). Any metal known to form a conductive oxide, provided the metal meets other conditions set forth hereinafter, may be used as the first metal in the first region 125.

The second insulating layer 120 and the first region 125 disposed within may be constructed by any techniques known to the person of ordinary skill in the art having the benefit of the present disclosure.

Figure 3:
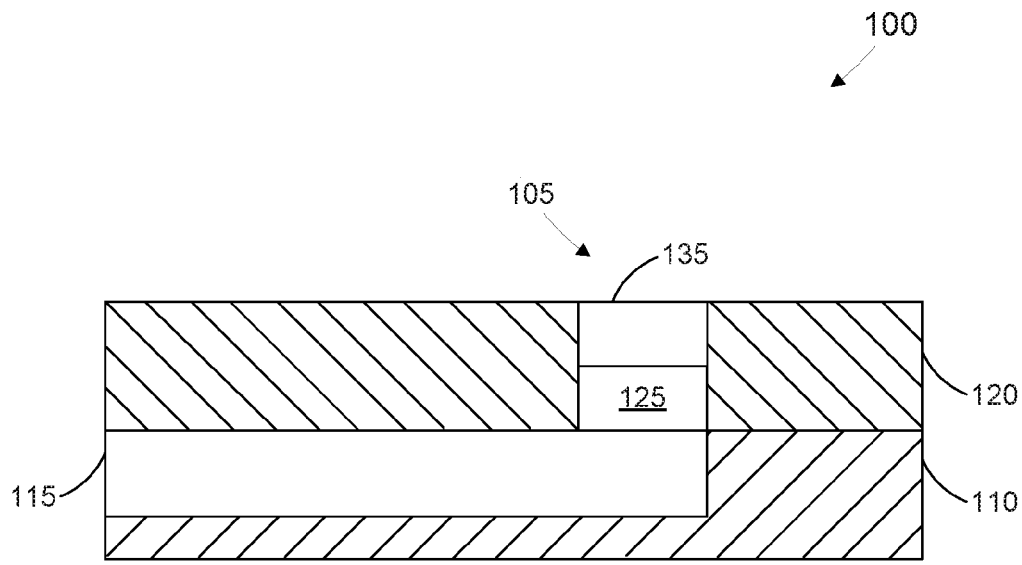
FIG. 3 illustrates a stylized cross-sectional depiction of a semiconductor device in accordance with embodiments herein.

FIG. 3 presents a stylized cross-sectional depiction of the semiconductor device 100 after formation of a second region 135 of the e-fuse 105. The second region 135 of the e-fuse 105 (e.g., a via) comprises a second metal. The second metal has a second electronegativity. Any metal may be used as the second metal in the second region 135 provided an oxide of the second metal is resistive (i.e., the oxide of the second metal is more resistive than the oxide of the first metal). The second region 135 may be formed by any technique known to the person of ordinary skill in the art having the benefit of the present disclosure.

In some embodiments, the greater the difference between the second electronegativity of the second metal and the first electronegativity of the first metal, the greater the movement of oxygen atoms and the more rapid the formation of the second metal oxide during localized joule heating. The difference between the first electronegativity of the first metal and the second electronegativity of the second metal may be termed the "electronegativity delta" between the first metal and the second metal. In such embodiments, the first metal and the second metal may be selected in view of their electronegativities as set forth in the following table.

TABLE 1

| Element name | Electronegativity |
| --- | --- |
| Selenium | 2.55 |
| Gold | 2.54 |
| Tungsten | 2.36 |
| Lead | 2.33 |
| Rhodium | 2.28 |
| Platinum | 2.28 |
| palladium | 2.20 |
| Iridium | 2.20 |
| ruthenium | 2.2 |
| Osmium | 2.2 |
| Astatine | 2.2 |
| molybdenum | 2.16 |
| Tellurium | 2.1 |
| antimony | 2.05 |
| Bismuth | 2.02 |
| germanium | 2.01 |
| Tin | 1.96 |
| Silver | 1.93 |
| Nickel | 1.91 |
| Silicon | 1.90 |
| Copper | 1.90 |
| technetium | 1.9 |
| Rhenium | 1.9 |
| Cobalt | 1.88 |
| Iron | 1.83 |
| Gallium | 1.81 |
| Indium | 1.78 |
| Cadmium | 1.69 |
| chromium | 1.66 |
| zinc | 1.65 |
| vanadium | 1.63 |
| aluminum | 1.61 |
| niobium | 1.6 |
| beryllium | 1.57 |
| manganese | 1.55 |
| titanium | 1.54 |
| tantalum | 1.5 |
| scandium | 1.36 |
| neptunium | 1.36 |
| zirconium | 1.33 |
| magnesium | 1.31 |
| hafnium | 1.3 |
| erbium | 1.24 |
| holmium | 1.23 |
| yttrium | 1.22 |
| dysprosium | 1.22 |
| gadolinium | 1.20 |
| samarium | 1.17 |
| neodymium | 1.14 |
| praseodymium | 1.13 |
| cerium | 1.12 |
| lanthanum | 1.10 |
| actinium | 1.1 |
| calcium | 1.00 |
| lithium | 0.98 |
| strontium | 0.95 |
| barium | 0.89 |
| potassium | 0.82 |
| rubidium | 0.82 |

In one embodiment, the first region 125 may comprise a conductive oxide of nickel or ruthenium. In one embodiment, the second region 135 may comprise titanium, aluminum, or both titanium and aluminum. Various combinations of first metal and second metal may be chosen. In one embodiment, the first metal is nickel and the second metal is titanium. In one embodiment, the first metal is ruthenium and the second metal is aluminum.

The e-fuse 105 may comprise additional regions (not shown in FIGS. 2-5), wherein each additional region comprises a conductive material. Exemplary conductive materials include, but are not limited to, titanium nitride or ruthenium oxide. In one embodiment, the additional region(s) may comprise the same material as the first region 125. For example, if the first region 125 comprises $RuO_2$, the additional region may also comprise $RuO_2$. Any additional regions may be formed by techniques known to the person of ordinary skill in the art having the benefit of the present disclosure. The additional region(s) may be disposed within the e-fuse 105 in any desired manner in accordance with the present disclosure. In one embodiment, the additional region(s) are disposed such that the second region 135 is disposed between first region 125 and the additional region(s).

Figure 4:
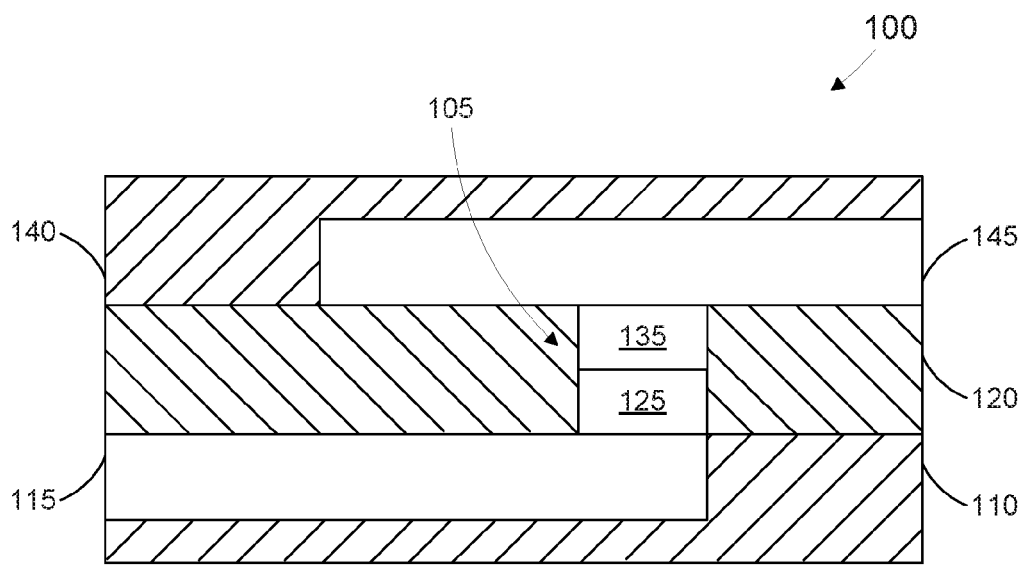
FIG. 4 illustrates a stylized cross-sectional depiction of a semiconductor device in accordance with embodiments herein.

FIG. 4 presents a stylized cross-sectional depiction of the semiconductor device 100 after formation of a second insulating layer 140 and a second conductive element 145 disposed within. The second insulating layer 140 may comprise any material known to the person of ordinary skill in the art as an electrical insulator suitable for use in semiconductor devices. The second insulating layer 140 may, but need not, comprise the same material as the first insulating layer 110. The second conductive element 145 may comprise any material known to the person of ordinary skill in the art as an electrical conductor suitable for use in semiconductor devices. The second conductive element 145 may, but need not, comprise the same material as the first conductive element 115. The second insulating layer 140 and the second conducting element 145 disposed within may be constructed by any techniques known to the person of ordinary skill in the art having the benefit of the present disclosure.

Regardless whether the e-fuse 105 comprises one or more regions in addition to first region 125 and second region 135, the e-fuse 105 is electrically connected to both the first conductive element 115 and the second conductive element 145. Because the first region 125 of the e-fuse 105 comprises a conductive oxide of the first metal and the second region 135 of the e-fuse 105 comprises the second metal, the e-fuse 105 is a conductive structure, thereby allowing current to flow between first conductive element 115 and second conductive element 145 through e-fuse 105.

However, when currents of sufficiently high power flow through the e-fuse 105, the e-fuse 105 may undergo a transition that renders it a more highly resistive structure, thereby blocking current flow between the first conductive element 115 and the second conductive element 145 through the e-fuse 105. Though not to be bound by theory, upon delivery of higher-power electric current (which may be AC, DC, or pulsed) to the first conductive element 115 or the second conductive element 145 of semiconductor device 100, localized joule heating occurs. In one embodiment, the higher-power electric current may have a voltage of about 0.1-5 V and a current of about 25 µA-10 mA. As a result, the conductive oxide of the first metal releases at least some oxygen (in other words, the first conductive element 115 becomes more metal-rich and conductive), and the released oxygen forms a more highly resistive oxide with the second metal. As more resistive second metal oxide is formed, more joule heating occurs, thereby accelerating the formation of further resistive second metal oxide. Though not to be bound by theory, the greater the electronegativity delta, the lesser the voltage and/or amperage of the higher-power electric current required to form the resistive second metal oxide. The end result is a "blow-out" state of the e-fuse 105 (i.e., a high resistance state). It should be noted that the "higher-power electric current" referred to here may require much lower voltage and current than is required to thermally blow-out and rupture the structure of prior art e-fuse devices as described hereinabove. As stated above, the prior art requires blow-out voltages of about 1-10 V and current of about 1-100 mA.

Figure 5:
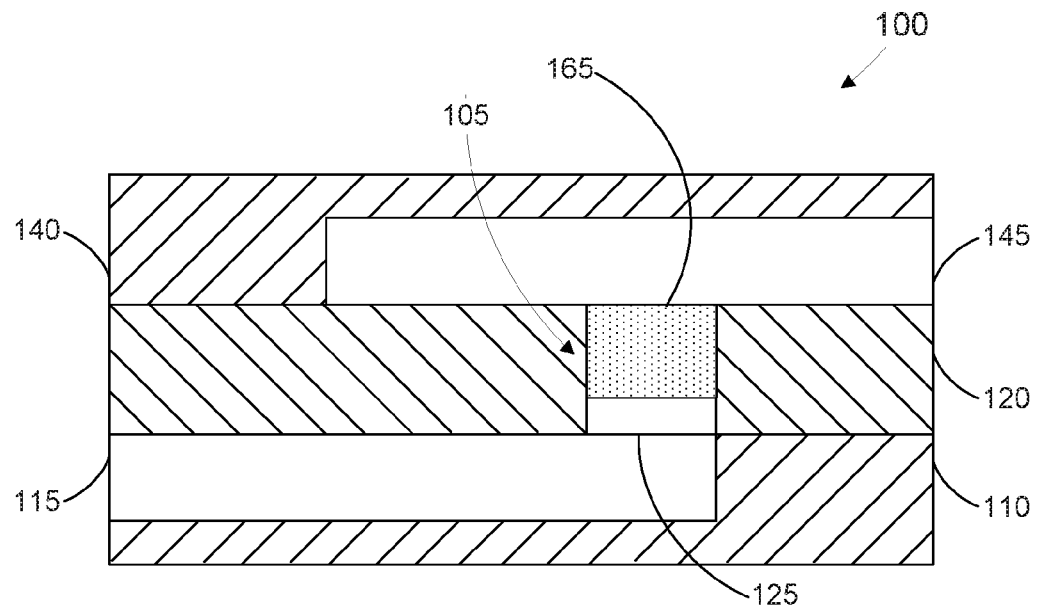
FIG. 5 illustrates a stylized cross-sectional depiction of a semiconductor device in accordance with embodiments herein.

FIG. 5 presents a stylized cross-sectional depiction of the semiconductor device 100 after formation of a more highly resistive oxide of the second metal in the e-fuse 105. In the stylized depiction, the second region 135 shown in FIGS. 3-4 has been replaced with a more highly resistive region 165. The resistive region 165 comprises the more highly resistive oxide of the second metal. As should be apparent, the resistive region 165 of the e-fuse 105 blocks current flow between the first conductive element 115 and the second conductive element 145.

Although FIGS. 1-5 show first conductive element 115 below second conductive element 145, with e-fuse 105 located between them, the person of ordinary skill in the art having the benefit of the present disclosure will understand that first conductive element 115 may have any spatial relationship (e.g., above, side-by-side with, vertically and/or horizontally offset from, etc.) second conductive element 145.

Particular examples of e-fuses are depicted in FIGS. 6A-9B, wherein the Arabic numeral in the figure designation refers to a single exemplary e-fuse, and the letter in the in the figure designation indicates whether the e-fuse is in a conductive conformation (A) or a more highly resistive (open, blown, or blown-out) conformation (B). In FIGS. 6A-9B, elements having the same reference numerals as elements in FIGS. 1-5 are identical to those elements of FIGS. 1-5, and need not be further described. Elements of FIGS. 6A-9B having reference numerals which differ only in the first digit from elements in FIGS. 1-5 are similar to those elements of FIGS. 1-5, with the differences to be described below.

Figures 6A, 6B:
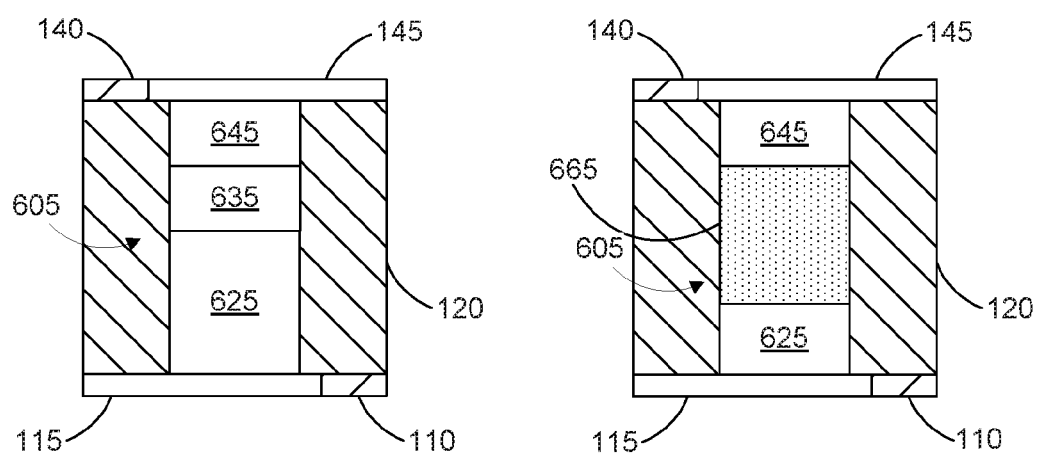
FIG. 6A illustrates a stylized cross-sectional depiction of a first e-fuse in a conductive conformation, in accordance with embodiments herein.
FIG. 6B illustrates a stylized cross-sectional depiction of the first e-fuse in a resistive conformation, in accordance with embodiments herein.

In FIG. 6A, an e-fuse 605 comprises a first region 625, a second region 635, and a third region 645. The first region 625 comprises nickel oxide. The nickel oxide may be deposited by any appropriate technique known to the person of ordinary skill in the art having the benefit of the present disclosure. In one embodiment, the nickel oxide may be deposited by physical vapor deposition (PVD) with an argon/oxygen plasma, or by a sol-gel technique. The resistivity of nickel oxide is typically from about 0.1 to about 2 Ωcm. In light of common via dimensions in contemporary semiconductor devices, the resistance of the first region 625 may be in the range of microohms.

The second region 635 comprises titanium, which may be deposited by any appropriate technique known to the person of ordinary skill in the art having the benefit of the present disclosure. The third region 645 may comprise titanium nitride. The e-fuse 605 is in a conductive conformation (i.e., current may flow between the first conductive element 115 and the second conductive element 145).

FIG. 6B depicts the e-fuse 605 after current of sufficiently high power is applied to at least one of the first conductive element 115 or the second conductive element 145. The application of the high power current has led to formation of a resistive region 665 comprising titanium oxide. In light of common via dimensions in contemporary semiconductor devices, the resistive region 665 may have a resistance in the range of megaohms, and the e-fuse 605 is in a more highly resistive conformation.

In FIG. 7A, an e-fuse 705 comprises a first region 725, a second region 735, and a third region 745. The first region 725 comprises ruthenium oxide. The ruthenium oxide may be deposited by any appropriate technique known to the person of ordinary skill in the art having the benefit of the present disclosure. In one embodiment, the ruthenium oxide may be deposited by physical vapor deposition (PVD) with an argon/oxygen plasma, or by chemical vapor deposition (CVD). The resistivity of ruthenium oxide is typically less than 1 mΩcm.

The second region 735 comprises aluminum, which may be deposited by any appropriate technique known to the person of ordinary skill in the art having the benefit of the present disclosure. The third region 745 may comprise ruthenium oxide, which has properties as described above and which may be deposited as described above. The e-fuse 705 is in a conductive conformation.

FIG. 7B depicts the e-fuse 705 after current of sufficiently high power is applied to at least one of the first conductive element 115 or the second conductive element 145. The application of the high power current has led to formation of a resistive region 765 comprising aluminum oxide. In light of common via dimensions in contemporary semiconductor devices, the resistive region 765 may have a very high resistance, and the e-fuse 705 is in a more highly resistive conformation.

Turning to FIG. 8A, an e-fuse 805 comprises a first region 825, a second region 835, and a third region 845. The first region 825 comprises ruthenium oxide, which may be deposited as described above. The second region 835 comprises titanium and aluminum, which may be deposited by any appropriate technique known to the person of ordinary skill in the art having the benefit of the present disclosure. The third region 845 comprises doped silicon. In the embodiment shown in FIG. 8A, the doped silicon is p-doped silicon (silicon comprising dopants that render third region 845 a p-type semiconductor, with such dopants being well-known to the person of ordinary skill in the art having the benefit of the present disclosure). The e-fuse 805 is in a conductive conformation.

FIG. 8B depicts the e-fuse 805 after current of sufficiently high power is applied to at least one of the first conductive element 115 or the second conductive element 145. The application of the high power current has led to formation of two more highly resistive regions 865 and 875, as a result of the different affinities of aluminum and titanium for oxygen and silicon, depending on the dopant type of the silicon in third region 845. First resistive region 865 comprises titanium oxide, which is highly resistive as discussed above. Second resistive region 875 comprises aluminum silicide. Silicides are known to be highly resistive, as demonstrated by the use of silicide wires in prior art e-fuses. Further, the aluminum silicide in second resistive region 875 is formed in situ and may be formed after fabrication of the semiconductor device 100 is complete, in contrast to prior art silicide e-fuses, which must be formed during fabrication and are incompatible with certain semiconductor device architectures and fabrication process flows. In light of common via dimensions in contemporary semiconductor devices, the first resistive region 865 and/or the second resistive region 875 may have a very high resistance, and the e-fuse 805 is in a more highly resistive conformation.

Turning to FIG. 9A, an e-fuse 905 comprises a first region 825, a second region 835, and a third region 945. The third region 945 comprises doped silicon. In the embodiment shown in FIG. 9A, the doped silicon is n-doped silicon (silicon comprising dopants that render third region 945 an n-type semiconductor, with such dopants being well-known to the person of ordinary skill in the art having the benefit of the present disclosure). The e-fuse 905 is in a conductive conformation.

FIG. 9B depicts the e-fuse 905 after current of sufficiently high power is applied to at least one of the first conductive element 115 or the second conductive element 145. The application of the high power current has led to formation of two more highly resistive regions 965 and 975, as a result of the different affinities of aluminum and titanium for oxygen and silicon, depending on the dopant type of the silicon in third region 945. First resistive region 965 comprises aluminum oxide, which is highly resistive. Second resistive region 975 comprises titanium silicide, which is also highly resistive. In light of common via dimensions in contemporary semiconductor devices, the first resistive region 965 and/or the second resistive region 975 may have a very high resistance, and the e-fuse 905 is in a resistive conformation.

Regardless of the particular embodiment, generally, an e-fuse 105, 605, 705, 805, or 905 in accordance with embodiments herein may be readily fabricated in replacement metal gate (RMG), middle-of-line (MOL) or back-end-of-line (BEOL) processes (and/or in processes forming finned field-effect transistor (FinFET) devices), at small sizes (on the order of tens of nanometers), at ambient temperatures, with minimal modification of existing semiconductor device fabrication processes, and/or may be easily blown with relatively low power current (relative to the power required to blow prior art e-fuses). The e-fuse 105, 605, 705, 805, or 905 may be blown at fab level or chip level. The e-fuse 105, 605, 705, 805, or 905 in accordance with embodiments herein may allow on-chip programmability.

Figure 10:
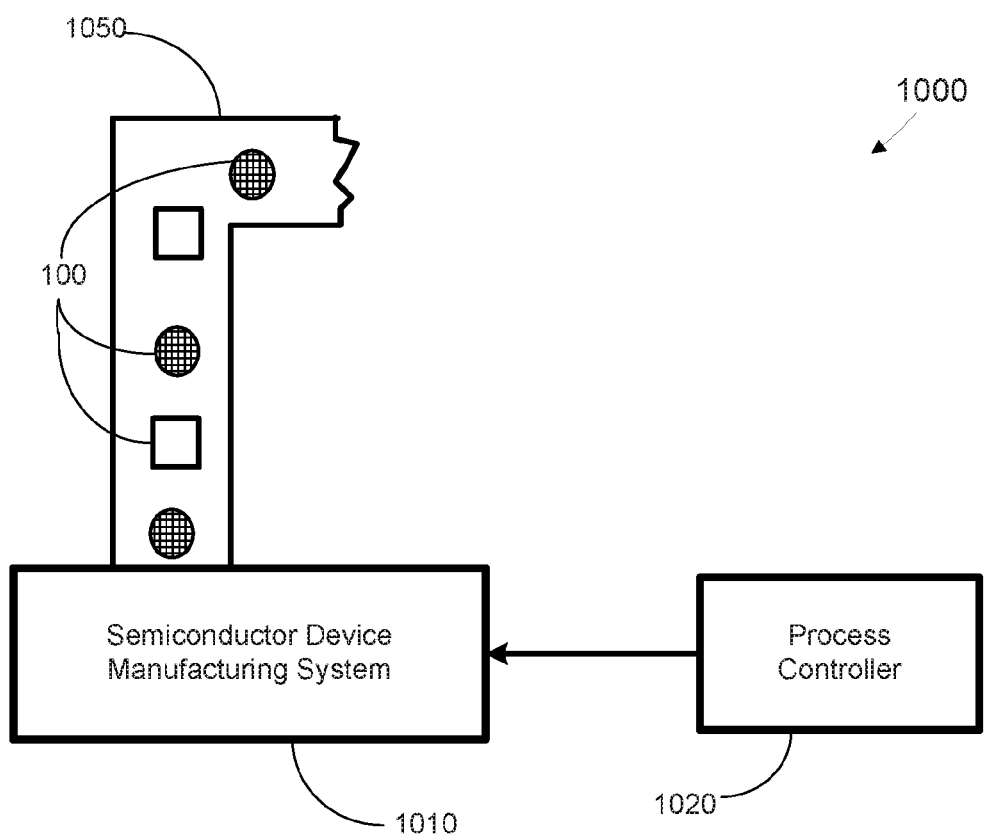
FIG. 10 illustrates a semiconductor device manufacturing system for manufacturing a device in accordance with embodiments herein.

Turning now to FIG. 10, a stylized depiction of a system for fabricating a semiconductor device 100, in accordance with embodiments herein, is illustrated. The system 1000 of FIG. 10 may comprise a semiconductor device manufacturing system 1010 and a process controller 1020. The semiconductor device manufacturing system 1010 may manufacture semiconductor devices based upon one or more instruction sets provided by the process controller 1020. In one embodiment, wherein the instruction set may comprise instructions to form a first conductive element of a semiconductor device; form a first region of an e-fuse electrically connected to the first conductive element, wherein the first region comprises a conductive oxide of a first metal; form a second region of the e-fuse adjacent and electrically connected to the first region, wherein the second region comprises a second metal and an oxide of the second metal is resistive; and form a second conductive element of the semiconductor device electrically connected to the e-fuse; wherein an instruction set comprises a plurality of parameters for manufacture of the semiconductor device.

The semiconductor device manufacturing system 1010 may comprise various processing stations, such as etch process stations, photolithography process stations, CMP process stations, etc. One or more of the processing steps performed by the semiconductor device manufacturing system 1010 may be controlled by the process controller 1020. The process controller 1020 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 1010 may produce semiconductor devices 100 (e.g., integrated circuits) on a medium, such as silicon wafers. The semiconductor device manufacturing system 1010 may provide processed semiconductor devices 100 on a transport mechanism 1050, such as a conveyor system. In some embodiments, the conveyor system may be sophisticated clean room transport systems that are capable of transporting semiconductor wafers. In one embodiment, the semiconductor device manufacturing system 1010 may comprise a plurality of processing steps, e.g., the $1^{st}$ process step, the $2^{nd}$ process step, etc.

In some embodiments, the items labeled "100" may represent individual wafers, and in other embodiments, the items 100 may represent a group of semiconductor wafers, e.g., a "lot" of semiconductor wafers. The semiconductor device 100 may comprise one or more of a transistor, a capacitor, a resistor, a memory cell, a processor, and/or the like. In one embodiment, the semiconductor device 100 comprises a back end of line (BEOL) stack. The semiconductor device 1015 may comprise an e-fuse 105, a first conductive element 115, and a second conductive element 145, as described above.

The system 1000 may be capable of manufacturing various products involving various technologies. For example, the system 1000 may produce devices of CMOS technology, Flash technology, BiCMOS technology, power devices, memory devices (e.g., DRAM devices), NAND memory devices, and/or various other semiconductor technologies.

Figure 11:
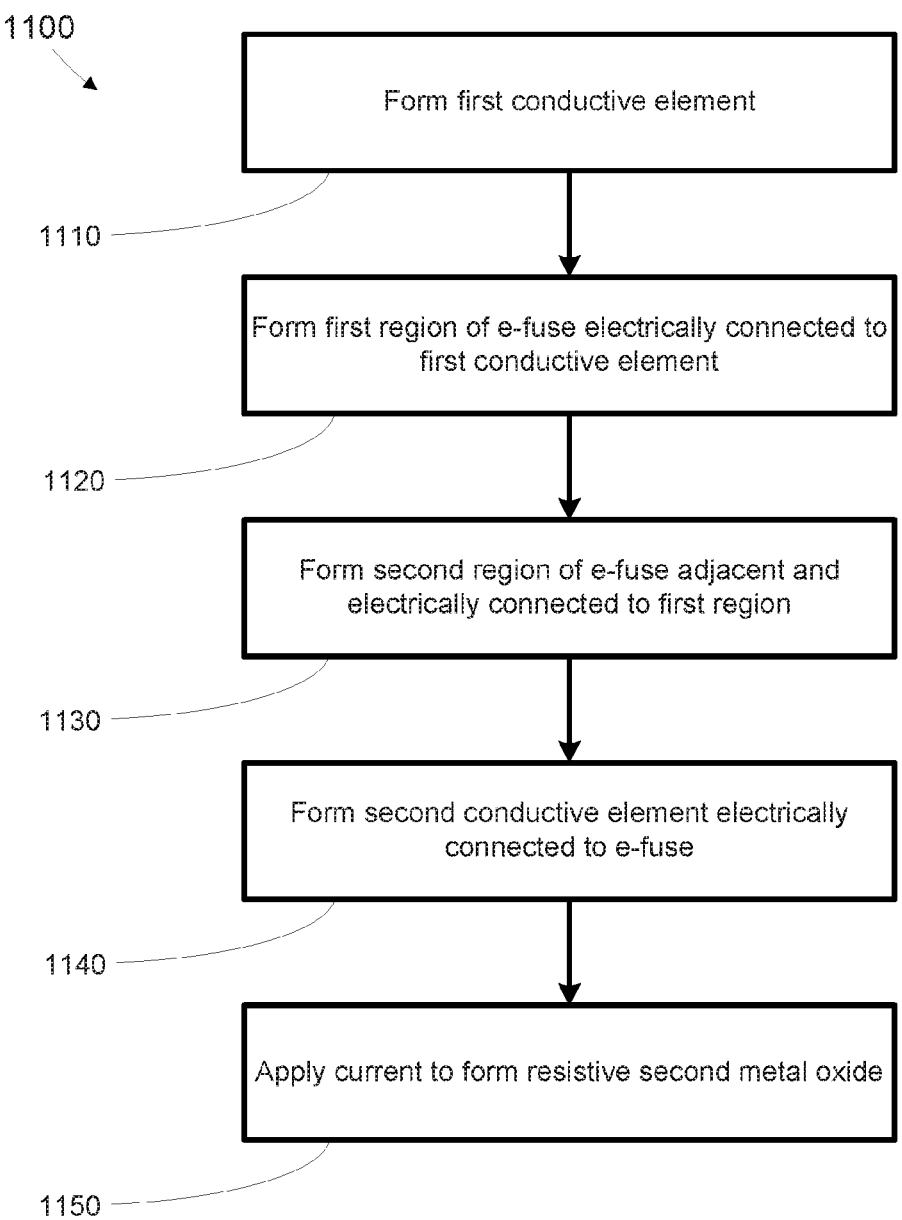
FIG. 11 illustrates a flowchart of a method in accordance with embodiments herein.

Turning to FIG. 11, a flowchart of a method 1100 in accordance with embodiments herein is depicted. The method 1100 comprises forming (at 1110) a first conductive element 115 of a semiconductor device 100. The method 1100 also comprises forming (at 1120) a first region 125 of an e-fuse 105 electrically connected to the first conductive element 115, wherein the first region 125 comprises a conductive oxide of a first metal, wherein the first metal has a first electronegativity. Similarly, the method 1100 comprises forming (at 1130) a second region 135 of the e-fuse 105 electrically connected to the first region 125, wherein the second region 135 comprises a second metal, wherein the second metal has a second electronegativity and an oxide of the second metal is resistive.

The method 1100 further comprises forming (at 1140) a second conductive element 145 of the semiconductor device 100 electrically connected to the e-fuse 105. Upon forming (at 1140), the e-fuse 105 of the semiconductor device 100 is in a conductive conformation.

The method 1100 may further comprise applying (at 1150) a current to at least one of the first conductive element 115 or the second conductive element 145, wherein the current has a power sufficient to release at least some oxygen from the conductive oxide of the first metal, whereby the oxide of the second metal is formed. Upon applying (at 1150), the e-fuse 105 of the semiconductor device 100 is in a resistive conformation.

The methods described above may be governed by instructions that are stored in a non-transitory computer readable storage medium and that are executed by, e.g., a processor in a computing device. Each of the operations described herein (e.g., FIG. 7) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first conductive element of a semiconductor device;
    forming a first region of an e-fuse electrically connected to the first conductive element, wherein the first region comprises a conductive oxide of a first metal;
    forming a second region of the e-fuse adjacent and electrically connected to the first region, wherein the second region comprises a second metal, wherein an oxide of the second metal is resistive;
    forming a second conductive element of the semiconductor device electrically connected to the e-fuse.

2. The method of claim 1, wherein the first metal is nickel and the second metal is titanium, and the nickel oxide is deposited by physical vapor deposition (PVD).

3. The method of claim 1, wherein the first metal is ruthenium and the second metal is aluminum, and the ruthenium oxide is deposited by physical vapor deposition (PVD) or chemical vapor deposition (CVD).

4. The method of claim 1, wherein the e-fuse further comprises a third region comprising doped silicon, and wherein the first metal is ruthenium, the second region comprises titanium and aluminum, the second region is disposed between the first region and the third region, and the ruthenium oxide is deposited by physical vapor deposition (PVD) or chemical vapor deposition (CVD).

5. The method of claim 4, wherein the doped silicon is p-doped silicon.

6. The method of claim 4, wherein the doped silicon is n-doped silicon.

7. The method of claim 1, wherein the first conductive element is a first metal layer; the second conductive element is a second metal layer; and the e-fuse is a via connecting the first metal layer and the second metal layer.

8. The method of claim 1, further comprising:
    applying a current to at least one of the first conductive element or the second conductive element, wherein the current has a power sufficient to release at least some oxygen from the conductive oxide of the first metal, whereby the oxide of the second metal is formed.

9. The method of claim 4, further comprising:
    applying a current to at least one of the first conductive element or the second element, wherein the current has a power sufficient to release at least some oxygen from the ruthenium oxide, whereby an oxide of either titanium or aluminum and a silicide of the other of either titanium or aluminum are formed, wherein the oxide of titanium or aluminum and the silicide of titanium or aluminum are high resistive phases.

10. A method, comprising:
    forming a first conductive element disposed within a first insulating layer of a semiconductor device;
    forming a first region of an e-fuse disposed within a second insulating layer of the semiconductor device and electrically connected to the first conductive element, wherein the first region comprises a conductive oxide of a first metal;
    forming a second region of the e-fuse disposed within the second insulating layer of the semiconductor device and both adjacent and electrically connected to the first region, wherein the second region comprises a second metal, wherein an oxide of the second metal is resistive;
    forming a second conductive element disposed within a third insulating layer of the semiconductor device and electrically connected to the e-fuse.

11. The method of claim 10, wherein the first metal is nickel and the second metal is titanium, and the nickel oxide is deposited by physical vapor deposition (PVD).

12. The method of claim 10, wherein the first metal is ruthenium and the second metal is aluminum, and the ruthenium oxide is deposited by physical vapor deposition (PVD) or chemical vapor deposition (CVD).

13. The method of claim 10, wherein the first insulating layer comprises silicon oxide or a low-K dielectric, and wherein the second insulating layer comprises silicon oxide or a low-K dielectric.

14. The method of claim 10, wherein the e-fuse further comprises a third region comprising doped silicon, and wherein the first metal is ruthenium, the second region comprises titanium and aluminum, the second region is disposed between the first region and the third region, and the ruthenium oxide is deposited by physical vapor deposition (PVD) or chemical vapor deposition (CVD).

15. The method of claim 10, wherein the first conductive element is a first metal layer; the second conductive element is a second metal layer; and the e-fuse is a via connecting the first metal layer and the second metal layer.

16. The method of claim 10, further comprising:
    applying a current to at least one of the first conductive element or the second conductive element, wherein the current has a power sufficient to release at least some oxygen from the conductive oxide of the first metal, whereby the oxide of the second metal is formed.

17. The method of claim 14, further comprising:
    applying a current to at least one of the first conductive element or the second element, wherein the current has a power sufficient to release at least some oxygen from the ruthenium oxide, whereby an oxide of either titanium or aluminum and a silicide of the other of either titanium or aluminum are formed, wherein the oxide of titanium or aluminum and the silicide of titanium or aluminum are high resistive phases.

18. A method for forming an e-fuse in a semiconductor device, comprising:
    forming a first metal layer disposed within a first insulating layer of the semiconductor device;
    forming a first region of a via disposed within a second insulating layer of the semiconductor device and electrically connected to the first metal layer, wherein the first region comprises a conductive oxide of a first metal;
    forming a second region of the via disposed within the second insulating layer of the semiconductor device and both adjacent and electrically connected to the first region, wherein the second region comprises a second metal, wherein an oxide of the second metal is resistive;

applying a current to the first metal layer for releasing at least some oxygen from the conductive oxide, forming the oxide of the second metal; and forming a second conductive element disposed within a third insulating layer of the semiconductor device and electrically connected to the via.

19. The method of claim 18, further comprising:

applying a current to the second conductive element, wherein the current has a power sufficient to release at least some oxygen from the conductive oxide of the first metal.

20. The method of claim 18, further comprising:

applying a current to at least one of the first conductive element or the second element, wherein the current has a power sufficient to release at least some oxygen from the ruthenium oxide, whereby an oxide of either titanium or aluminum and a silicide of the other of either titanium or aluminum are formed, wherein the oxide of titanium or aluminum and the silicide of titanium or aluminum are high resistive phases.

\* \* \* \* \*